United States Patent
Bapst et al.

(10) Patent No.: US 6,581,019 B1
(45) Date of Patent: Jun. 17, 2003

(54) COMPUTER-SYSTEM-ON-A-CHIP WITH TEST-MODE ADDRESSING OF NORMALLY OFF-BUS INPUT/OUTPUT PORTS

(75) Inventors: Mark V. Bapst, South Barrington, IL (US); Robert J. Caesar, Duluth, GA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/528,887

(22) Filed: Mar. 20, 2000

(51) Int. Cl.[7] .............................................. G01R 31/00
(52) U.S. Cl. ...................................... 702/120; 702/117
(58) Field of Search ................................. 702/117, 118, 702/119, 120, 121, 122, 123, 124; 716/1, 4, 7, 8, 9, 10, 11, 17; 712/227; 703/13, 14, 15, 16, 17; 714/718–734

(56) References Cited

U.S. PATENT DOCUMENTS

| | | | | |
|---|---|---|---|---|
| 4,070,565 A | * | 1/1978 | Borrelli ........................ 714/734 |
| 4,155,116 A | * | 5/1979 | Tawfik et al. .................. 700/81 |
| 4,566,104 A | * | 1/1986 | Bradshaw et al. ........... 714/726 |
| 4,965,511 A | * | 10/1990 | Nishimura et al. ......... 324/73.1 |
| 5,121,393 A | * | 6/1992 | Charvin ......................... 714/30 |
| 5,426,649 A | * | 6/1995 | Blecha, Jr. .................. 714/724 |
| 5,428,770 A | * | 6/1995 | Garner ......................... 714/733 |
| 5,481,471 A | * | 1/1996 | Naglestad et al. .............. 716/4 |
| 5,515,382 A | * | 5/1996 | Lassorie ...................... 714/730 |
| 5,748,642 A | * | 5/1998 | Lesmeister ................... 714/724 |
| 5,774,708 A | * | 6/1998 | Klingler ....................... 712/227 |
| 5,936,974 A | * | 8/1999 | Roberts et al. .............. 714/718 |
| 6,052,806 A | * | 4/2000 | Beat ............................ 714/718 |

* cited by examiner

Primary Examiner—Marc S. Hoff
Assistant Examiner—Jeffrey R West
(74) Attorney, Agent, or Firm—Peter Zawilski (57) ABSTRACT

An embedded-controller-based system, such as a personal digital assistant (PDA), includes a system-on-a-chip with a processor, system bus, memory, and system-bus peripherals. The system-bus peripherals include connections to data paths that are not accessible from the system bus during execution of application programs. Associated with these connections are test drivers that include registers that can be written to by the processor via the system bus for software controllability. When the processor executes a test program, it writes test values to these registers. Some bits of the test values are used to control multiplexers so that they can decouple function block ports from the non-system-bus connections and then couple the remaining bits of the registers. In this way, a test program can write data directly to the non-system bus connections. The results of the test data being applied at the source of inter-block connections can be read from the destinations using test samplers. The test samplers can be taps to function block ports that are multiplexed to the system bus for reading during a test procedure for software observability. Thus, both bus connections and non-bus connections can be tested by a program running the system processor without requiring external test equipment.

24 Claims, 4 Drawing Sheets

COMPUTER-SYSTEM-ON-A-CHIP WITH TEST-MODE ADDRESSING OF NORMALLY OFF-BUS INPUT/OUTPUT PORTS

BACKGROUND OF THE INVENTION

The present invention relates to computers and, more particularly, to testing computer systems fabricated on an integrated circuit. A major objective of the present invention is to provide computer-system-on-a-chip designs with enhanced built-in testability.

Much of modern progress is associated with the increasing prevalence of computers, including embedded controllers as well as general-purpose computers. A typical computer includes a processor, memory, and peripherals that communicate with each other over a system bus. In many computers, the processor, memory, and some peripherals are embodied in separate integrated circuits. However, with advances in integrated-circuit manufacturing technology allowing millions of transistors on an integrated circuit, it is now practical to build computer systems on an integrated circuit (chip). Instead of assembling separate integrated circuits on a printed-circuit board, computers can be designed by assembling functional blocks on an integrated-circuit layout.

Testing of complex integrated circuits, such as single-chip computers is an essential and formidable task. While the functional block designs are often well characterized, they are subject to manufacturing defects. In addition, each circuit design represents a novel arrangement of functional blocks that requires testing both for design integrity and for defects in the connections between function blocks.

The prior art provides a default method for testing a computer system. A test program can be run on the computer processor, which can write to peripherals coupled to the system bus and then read from the system bus to determine if the expected results occur. While much can be accomplished with this approach, it is typically not effective at testing non-system-bus connections between on-chip peripherals or between on-chip peripherals and off-chip devices. Likewise, on-chip functions that rely on non-system-bus inputs, e.g., communications from a modem, can be hard to evaluate. Accordingly, several approaches to augmenting this processor-based testing approach have been considered.

One prior-art "multiplex-to-pins" approach is to multiplex the input-output ports of functional blocks to provide controllability of input and observability of outputs. This allows for external test equipment to test the non-system bus connections. A major problem with this multiplex-to-pins approach is that it precludes many possible test combinations. Tests requiring more than one use of a pin at a time cannot be performed. If a pin is used to access an internal connection, its normal use is precluded. Likewise, if a pin is multiplexed to more than one internal connection, only one of these may be accessed at a time. Even with careful assignment of pins to internal connections, the restrictions on test combinations can be prohibitive. Typically, only a single peripheral is tested, not its connections to the rest of the system, thus degrading a key goal of the test. In addition, the multiplex-to-pins approach requires flexible test hardware to map peripheral test patterns to pins—since that mapping varies from device to device.

In addition, this multiplex-to-pins approach becomes less practical as the number of internal connections increases relative to the number of pins. Multiplexing internal connections to pins consumes routing resources, and the inter-blocks routes tend to be very costly in terms of area. Moreover, non-test application performance can be adversely affected not only by the additional multiplexers, but also by the parasitic capacitances along the paths between the input-output ports and the pins.

Scanning approaches introduce data serially and read out the results serially, thus avoiding much of the routing complexity of the multiplex-to-pins approach. JTAG ("Joint Test Action Group") is a standardized test-interface specification for the scanning. The JTAG specification requires a five-pin interface to test equipment. These pins are "serial test-data in" (TDI), "serial test-data out" (TDO), "test clock" (TCK), "test reset" (TRST), and "test-mode select" (TMS). Thus, the number of pins required for testing using the prevailing scan approaches is small and fixed. Thus, problems with routing and test-pin count are vastly reduced compared to the multiplex-to-pins approach.

The vast majority of complex chips use a "fulls scan" approach to test for manufacturing faults. In the full-scan approach, all registers, including those internal to functional blocks, are arranged in a serial shift chain. Typically, the order of registers in a full-scan serial-shift chain is not determined as part of the design process, but as an automated post-design procedure. Due to the functionally arbitrary order and large number of registers involved, functional testing using the full-scan approach is impractical. Instead, functional testing is achieved by simulation, and the full scan is used to check for manufacturing faults. Furthermore, scan approaches are destructive in nature, since old state data will be shifted out as new data is shifted in.

The simulation used for design validation and the full scan used for finding manufacturing faults are performed before an integrated circuit is integrated into a system. Configurations not anticipated in the simulation are not tested. Latent manufacturing defects that become overt during use (e.g., due to gradual electro-migration) may not be detected by the full scan. In addition, in view of the large amount of shifting required, the full scan can be very time consuming.

The prior-art also reaches a more limited "peripheral-scan" (also known as "partial-scan" or "scan-wrapper") approach. In the peripheral-scan approach, non-system-bus functional block ports are multiplexed to latches or registers arranged in a serial shift chain. Test data can be shifted in from external test equipment, a clock cycle run to clock data into the peripheral and capture outputs, and then the data can be shifted out to the external test equipment. Thus, the peripheral-scan approach can be used for functional testing. However, scanning data in and out is still quite time consuming.

The approaches discussed above all involve difficult tradeoffs. While the full-scan is relatively comprehensive in the components it can test, it is impractical to use it for functional testing. On the other hand, while a peripheral-scan allows for functional testing, the range of components that are tested is more limited than it is for the full-scan approach. The multiplex-to-pins approach is faster, but is costly in terms of routing resources.

A bus-access approach couples external testing equipment a system bus. Each module to be tested has a test harness with test registers. Each test register can be associated with a module input or outputs. During testing, these registers are coupled to the system bus so that they can be accessed by the external test equipment. Such a test approach is disclosed by Arm Limited in "AHB Example AMBA System Technical Reference Manual". This document was obtained in the year 2000 the Arm, Limited website at www.arm.com. The document is copyrighted 1999, and no publication date is given.

The bus-access approach is faster than the scan approaches and consumes fewer routing resources than does the multiplex-to-pins approach. However, Arm's implementation still requires thirty-six dedicated pins, which is costly in terms of packages and board area.

The bus-access, scan and the multiplex-to-pin approaches share many limitations. A salient limitation is the requirement for dedicated testing equipment. The testing equipment is expensive. The requirement of the external testing makes it impractical to test circuits once they are in use, which, in turn, makes it difficult to test in the context of signals associated with normal use.

More generally, the bus-access, scan, and multiplex-to-pins approaches all require a test mode in which conditions are very difficult from normal operation. Functional modules are not performing their normal functions and none of the circuitry being tested is operating at normal speed. Thus, many problems that could occur during normal functioning at normal operating speed may not occur under test conditions. Thus, differences between test conditions and normal operating conditions limit test comprehensiveness.

Summarizing the known prior art, the multiplex-in-pins and scan approaches expand upon the default processor-based approach to testing integrated circuits generally, and system-on-a-chip computers specifically. The multiplex-to-pins approach allows relatively rapid testing; however, it imposes severe limits on combinations of inputs that can be applied during testing, and it can be expensive in terms of routing resources. The scan approaches allow data to be scanned or shifted to and from the non-system-bus ports; this approach is less taxing on routing resources and less restrictive of the test inputs. However, the serial scanning of data into and out of the integrated circuit is time consuming. Sophisticated test software is required to stimulate and observe specific areas of the design. All these approaches are limited by the requirement of dedicated test equipment and test conditions that are very different from normal operation.

What is needed is a novel approach to enhancing the default testing that does not require external testing equipment. Preferably, the novel approach would be less taxing on routing resources than is the pin-multiplexing approach. Also, preferably, the novel approach would be less time-consuming than the scan approaches. Finally, it is desired that testing under near-normal operating conditions be available after an integrated circuit is installed in an incorporating system.

SUMMARY OF THE INVENTION

The present invention provides for system self-testing in which a processor has access via a system bus both to bus and non-bus connections. The non-bus connections are made accessible through the bus during testing (but not during execution of normal application programs) via multiplexers. The invention is especially applicable to embedded controllers and system-on-a-chip computers. The computer system includes a processor, a system bus, and a set of peripherals, all of which can be fabricated on a single integrated circuit.

The system also includes test-driver multiplexers and test-driver registers. Each register has a data input coupled to the system bus and a control input coupled to an address decoder. The address decoder decodes addresses asserted by the processor to determine when to enable the register so that it can be written to.

One of the integrated peripherals is connected either to one of the multiplexer data inputs or to the multiplexer output. The other of these two multiplexer ports is coupled to another functional module. This other functional module can also be one of the integrated peripherals or it can be a non-peripheral on-chip functional module or it can be an external device. The remaining multiplexer data input is coupled to an output of said register.

Preferably, the multiplexer control input is also coupled to an output of said register, in this case, the control input and the second data input respond to different bit positions of a value stored in the register. Alternatively, another means can be used to control the multiplexer—e.g., the address decoder in response to a separate address assigned to control the multiplexer.

During execution of an application program, the test-driver multiplexer is set so that the peripheral and the functional module are connected. During execution of a test program, the test-driver multiplexer can be controlled so that the test-driver is selected as the active multiplexer input. In this case, the data value is provided to whichever functional module is connected to the test-driver multiplexer output.

The invention provides a method in which a test program is initiated, data is written to a test-driver register via the system bus, a test-driver multiplexer is switched to connect the test-driver register output to a non-system-bus connection, and then the result of the test is read by the processor via the system bus. The reading of a test result can take different forms. In some cases, the result can be read by the processor via a system bus connection that is normally in place during execution of an application program. For example, the test can involve conveying the test data to a non-system-bus input of a system-bus-peripheral that, as a matter of course, makes the result available via the system bus.

If the peripheral receiving the test data is not connected to the system bus or does not provide the result of interest to the system bus as a matter of course, a test sampler can be used. For signals that can be statically controlled or that change slowly enough that polling by the processor will not miss any important states, a test sampler can involve a tap from a non-system-bus connection to a multiplexer having an output to the system bus. To observe transient states, sample-and-hold circuitry, trigger logic, and/or edge-sensitive logic can be used. In response to a read request, the multiplexer can be controlled to select the test-sampler as a bus input so that the processor can read non-system-bus data.

The invention provides for incorporating test drivers and/or test samplers in module function blocks for optimal design convenience in providing enhanced testability of computers systems on a chip. However, for function blocks not including required test drivers or test samplers, these can be provided external to the function blocks as part of a dedicated test-mode controller peripheral. The required registers can be written to by addressing the test-mode controller peripheral, which also controls the associated test-driver multiplexers.

A major advantage of the present invention over the default processor-based testing scenario is that there is direct testability of ports not normally addressable by a processor over a system bus. The invention consumes fewer routing resources than does the multiplex-to-pins approach, and it much less time consuming than the scanning approach. In part because of its speed, the present invention makes comprehensive functional testing practical, in contrast to both the peripheral-scan approach and the full-scan approach.

A major advantage over the alternative enhancements to the default approach is that no external testing equipment is required. Moreover, tests can be run in context and at normal operating speeds so that test conditions more closely compare to normal operation. Accordingly, the validity of test results is enhanced.

Furthermore, test drivers and samplers can be selected individually; and unselected circuitry can functional normally and at full speed. The precision with which tests can be directed permits testing to go beyond merely determining whether or not an integrated circuit functions as intended; the present invention allows faults to be isolated. In other words, the present invention allows not only validation but also debugging of circuitry. These and other features and advantages of the invention are apparent from the description below with reference to the following drawings.

BRIEF DESCRIPTION OF THE DRAWINGS

In FIGS. 2 and 3, test-driver multiplexer data inputs selected during application program execution are labeled "D1", test-driver multiplexer data inputs that are selected only during test program execution are labeled "D2", test-driver multiplexer outputs are labeled "DQ", and test-driver multiplexer control inputs are labeled "CI".

DESCRIPTION OF THE PREFERRED EMBODIMENTS

Figure 1:
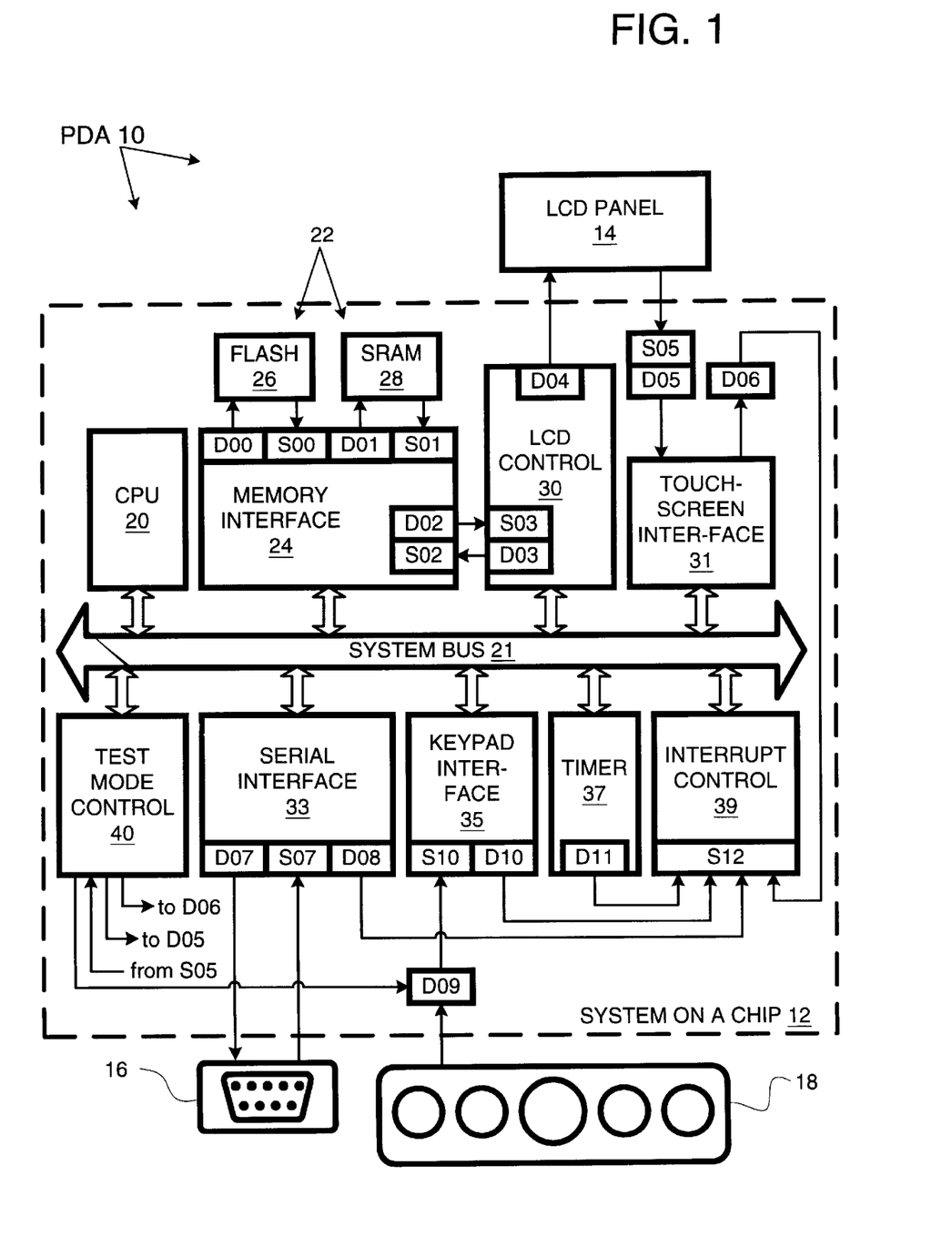
FIG. 1 is a block diagram of a personal digital assistant (PDA) incorporating the present invention.

In accordance with the present invention, a personal digital assistant PDA 10 comprises a system-on-a-chip 12, an LCD (liquid crystal display) panel 14, a serial connector 16, and a keypad 18 with five buttons, as shown in FIG. 1. PDA 10 belongs to a familiar class of consumer products in which the main user interface is a touch-screen LCD panel 14. Tactile buttons on keypad 18 provided for on/off and basic application mode control. A serial port allows for communication, e.g., with a desktop computer for data reconciliation and with the Internet via a modem.

Internally, system 12 includes a process ("central processing unit" or "CPU") 20, a system bus 21, a memory subsystem 22, and other peripherals. Memory 22 stores program instructions and user data. Processor 20 executes program instructions. System bus 21 provides for communication between processor 20, memory 22, and the various peripherals.

Memory 22 includes a memory interface 24, nonvolatile flash RAM (random access memory) 26, and volatile SRAM (static random-access-memory) 28. Flash RAM 26 holds the operating system, as well as built-in application and test programs. SRAM 28 holds user data and serves as a scratch pad for data manipulations by processor 20.

System 12 includes six normal-mode bus peripherals. Bus peripherals related to LCD panel 14 include an LCD controller 30 and a touch-screen interface 31. An RS 232 serial controller 33 manages communications via serial connector 16. A keypad interface 35 handles inputs from keypad 18. A timer 37 provides internal timing for system 12. An interrupt controller 39 handles interrupts from other peripherals and informs processor 20 of their assertions. In addition to these six bus normal-mode peripherals, system 12 includes a test-mode controller 40 configured as a bus peripheral.

System 12 also includes several test circuits, including test drivers D00–D11, and test samples S00–S03, S05, S07, S10, and S12. Some test circuits, e.g., D00, S00, D04, S12, are internal to bus peripherals. In other words, the designs of these function blocks provide for these test circuits.

Other test circuits are not included in a function block. For example, driver node D09 is functionally associated with the output of off-chip keypad 18, and so has a separate on-chip location. Test driver D05 is similarly associated with an off-chip device, LCD panel 14. Test sampler S05 and test driver D06 are associated with touch-screen interface 31. In this case, a design module for a touch-screen interface with built-in test circuits was not available, accordingly, test circuits S05 and D06 are located external to touch-screen interface 31.

The test-circuits can manage single line and multi-line connections. For example, test circuits D00, S00, S01, D02 and S02, associated with memory transfers, involve 48-bit connections (including data, address, and control lines). Test-driver D04 is connected to an 11-bit path for conveying graphical data to LCD panel 14; while test circuits D05 and S05 are coupled to 8-bit paths conveying touch-screen information from LCD panel 14. Test circuits D07 and S07 are coupled to 5-bit paths involving serial interface 33. Test circuits D09 and S10 are coupled to 5-bit paths from keypad 18 to keypad interface 35. Test sampler S12 of interrupt controller 39 is 4-bits wide to accommodate four single-bit wide inputs from test drivers D06, D08, D10, and D11.

The bit-width of each test sampler corresponds to the bit-width of the path it is connected to. Each test driver includes a register that is wider than the path it is connected to. The extra bit or bits are used to control a multiplexer that switches its output between an off-bus connection (selected during normal operation) and the test of the bits in the register. In the typical case of a two-input multiplexer, the driver register is one-bit wider than the data path at the multiplexer output.

Figure 2:
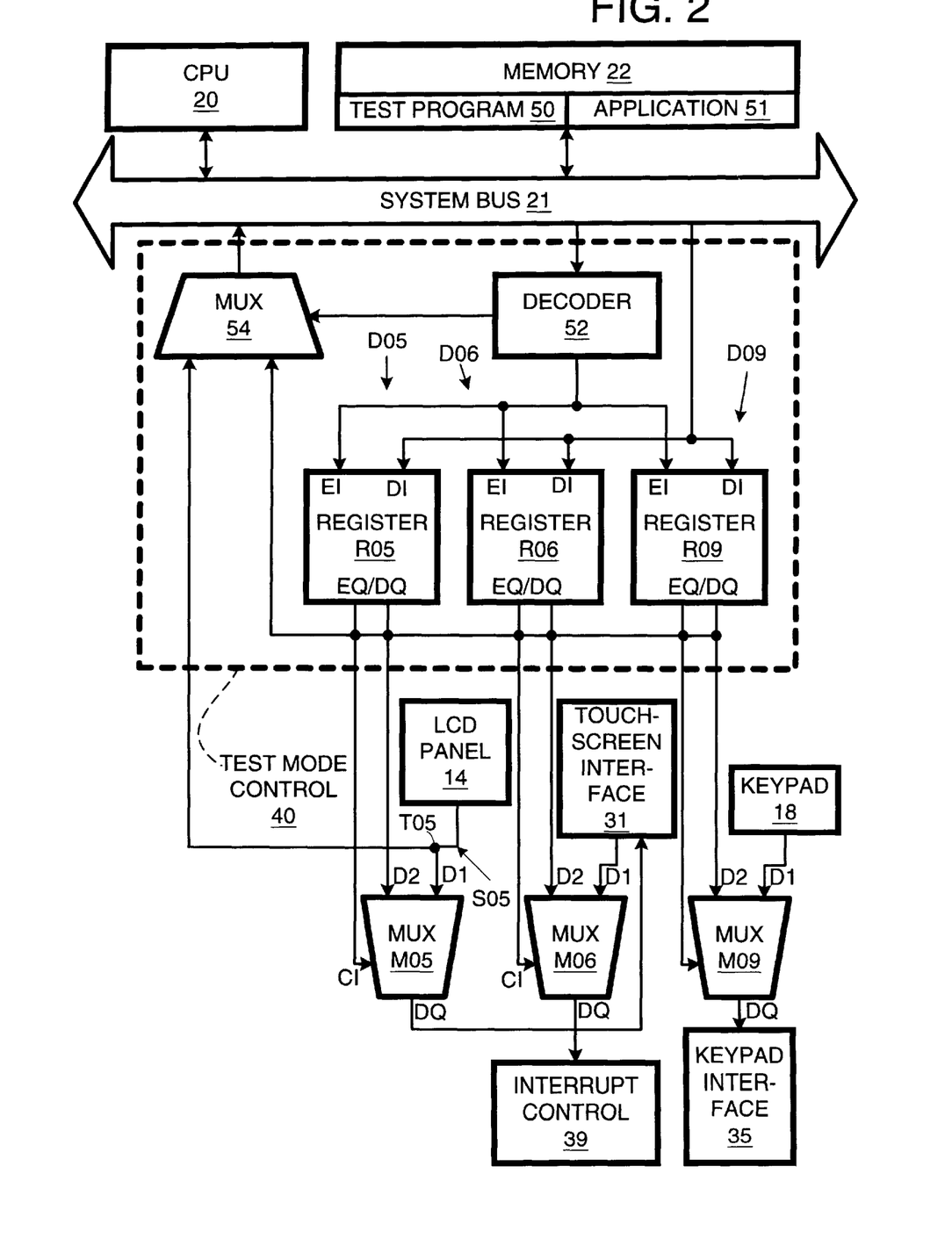
FIG. 2 is a block diagram of a keypad interface and some functional modules connected thereto of the PDA of FIG. 1.

In response to depression of a preset combination of the buttons on keypad 18, processor 20 begins execution of a test program 50, instead of an application program 51, FIG. 2. Among the instructions of test program 50 are instructions to write certain test values to test-mode controller 40. Accordingly, processor 20 issues write requests with associated addresses and data. Test-mode controller 40 includes an address decoder 52 that responds to the address by enabling all three test-driver registers R05, R06, and R09 so that can be written to in a single write operation. The different registers are connected to receive different bit positions of the data being written so that their contents can be independent.

Processor 20 can also read from registers R05, R06, and R09. To this end, processor 20 can issue a read request to the same address used for the write request. In response, decoder 52 controls multiplexer 54 so that its output is coupled to the outputs of registers R05, R06, and R09. Reading these registers can be used to confirm test settings or, in the context of a read-modify-write operation, to change the contents of one register without changing the contents of the others.

In this example, a 9-bit value is written to register R05. The most-significant bit is applied to a control input CI of multiplexer M05. When this control bit is zero, multiplexer M05 couples its output DQ to its first input D1; this input is coupled to the output of LCD panel 14 so that touch-screen data can be transmitted to touch-screen interface 8-bits at a time. The touch-screen data can be monitored by issuing a write command; the write command causes decoder 52 to couple a tap T05 from output of LCD panel 14 to bus 21. Note that the function of test sampler S05 involves tap T05 and multiplexer 54.

The touch-screen data is simulated by the least-significant 8 bits stored in register R05. When the most-significant bit of register R05 is one, multiplexer M05 couples its output to its second data input D2; this input is couple to the eight least-significant bits of registers R05. This provides simulation data to touch-screen interface R06 for test purposes. It can thus be seen that the function of test-driver D05 involves register R05 and multiplexer M05.

The more-significant bit of 2-bit register R06 controls multiplexer M06 to determine whether interrupt controller 39 is coupled to touch-screen interface 31 or to register R06. In the latter case, test-mode controller 40 can simulate or preclude an interrupt from touch-screen interface 31. Thus, the function of test driver D06 involves register R06 and multiplexer M06.

The most-significant bit of 6-bit register R09 controls multiplexer M09 to determine whether keypad interface 35 is coupled to receive from keypad 18 or from register R09. In the former case, keypad interface 35 receives five bits of data from keypad 18. In the latter case, register R09 can be used to simulate 5-bits of data from keypad 18, while precluding actual button presses from being detected by keypad interface 35. Thus, the function of test driver D09 involves register R09 and multiplexer M09.

Test-mode controller 40 directly controls test circuitry to simulate or monitor devices external to system-on-a-chip 12, FIG. 1. Test drivers D05 and D09 and test sampler S05 are examples. Test-mode controller 40 also controls test circuitry for function blocks without built in test counterparts. An example of this is test driver D06 for touch-screen interface 31.

In general, however, designing for testability is simplified if test circuits are designed into the function blocks. When built into a peripheral, test registers can be addressed at a known offset from the peripheral's base address. The least-significant bits of a register's base address would not vary from device to device. Thus, a common test routine could be used for many different devices.

Figure 3:
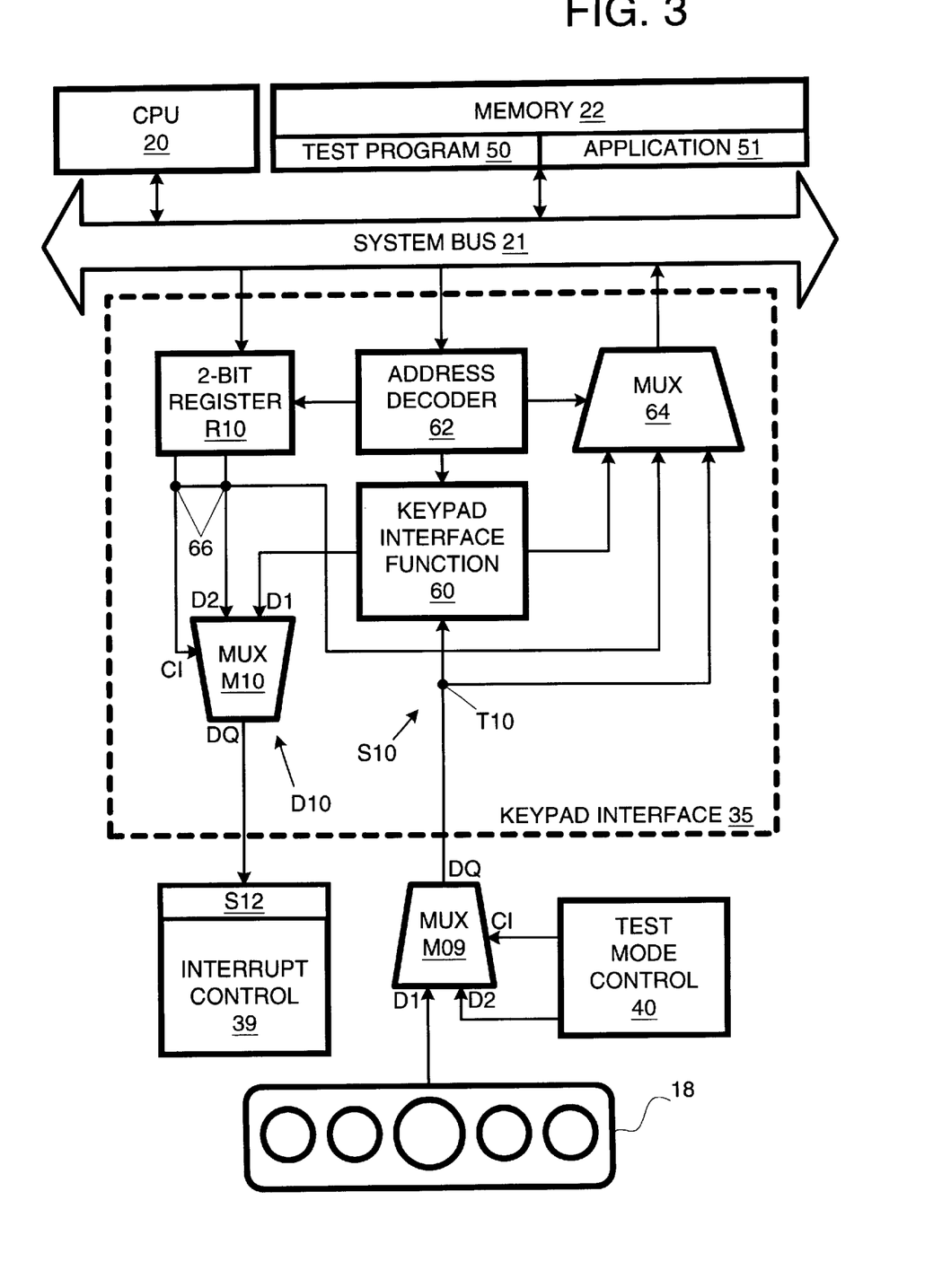
FIG. 3 is a block diagram of a mode selector of the PDA of FIG. 1.

The modifications required to a conventional keypad interface to yield keypad interface 35 are detailed with reference to FIG. 3. The modifications required for other functional blocks can be extrapolated by analogy with keypad interface 35.

Keypad interface 35 includes a keypad interface function 60, an address decoder 62, a 2-bit register R10, a driver multiplexer M10, and a read multiplexer 64. A precursor keypad interface 35 designed without the test enhancement of the present invention includes an identical keypad interface function and a similar address decoder. Keypad interface 35 modifies the address decoder to handle an additional address devoted to test functions. In addition, it adds register R10 and multiplexer M10, and widens multiplexer 64.

The outputs of keypad interface controller 60 are coupled to inputs of multiplexers M10 and 64, whereas the precursor keyboard interface controller has outputs coupled directly to interrupt controller 39 and system bus 21, respectively. To provide for testability, these connections are controlled in keypad interface 35.

Test driver D10 includes 2-bit register R10 and multiplexer M10. In addition, it provides a tap 66 from the outputs of register R10 to an input of multiplexer 64. Thus, processor 20 can issue a read request with the test address, causing tap 66 to be the selected input of multiplexer 64 so that processor 20 can read the contents of register R10.

Test sampler S10 involves tap T10 and multiplexer 64 to allow the keypad input to keypad interface function 60 to be monitored. Test sampler S10 serves primarily for continuity testing.

More generally, system-bus peripherals having outputs that are not normally connected to the system bus are provided with test-driver circuits. The test-driver circuits include a test-driver multiplexer coupled to whatever communications path the peripheral output is connected to in normal operation. The peripheral output is one input to the test-driver multiplexer. The peripheral is also provided with a register that is addressable by the system processor via the system bus. This register is coupled to another input of the test-driver multiplexer. Optionally, one or more of the register bit positions can be coupled to the control output of the test-driver multiplexer to determine which of its inputs is selected. Preferably, the register output is coupled, e.g., through another multiplexer, to the system bus so that its contents can be read directly by the processor.

A test-mode selector is provided to control test circuitry associated with non-system-bus, e.g., off-chip, peripherals. The arrangement of registers and multiplexers can be essentially the same as for the test-driver circuitry for non-system-bus outputs of system-bus peripherals. However, in this case, it is the test-mode selector that is addressed rather than the peripheral itself. The test-mode selector can also be used to control test drivers for system bus peripherals that, for whatever reason, have not been modified to include test drivers.

Test-samplers can be included in system-bus-peripherals at their non-system-bus inputs. The invention provides for including registers in the test samples. However, it is generally sufficient to provide a tap at such an input. The processor can then monitor the tap by addressing it through a multiplexer coupled to the system bus.

Monitoring a non-system bus signal with a tap is sufficient for signals that can be statically controlled or change slowly enough that polling by the processor will not miss any important states. If transient behavior must be observed, some other sample-and-hold, trigger logic, and/or edge-sensitive logic must be added to synchronize the signals to the processor. Dynamic sampling logic is highly application specific.

Figure 4:
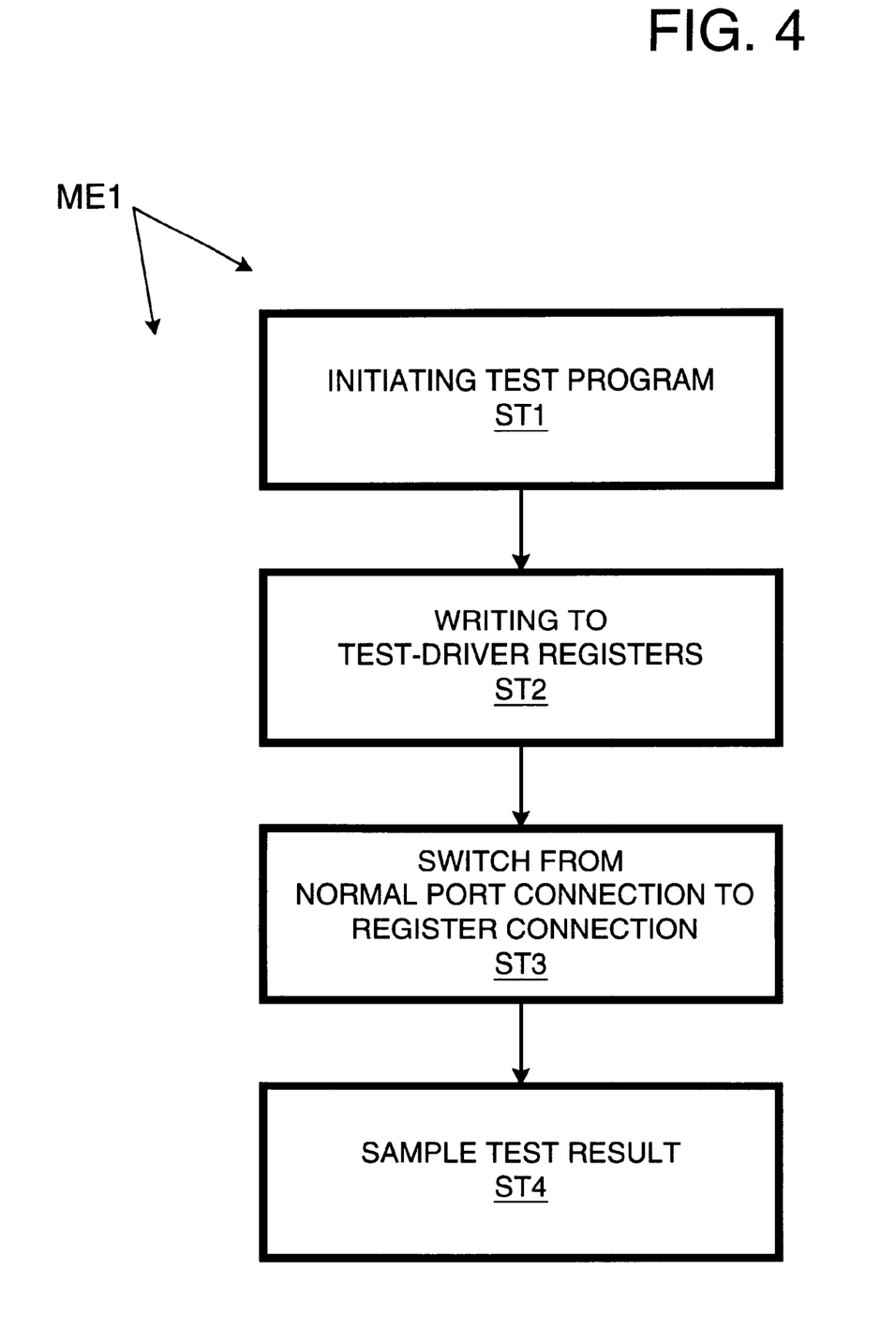
FIG. 4 is a flow chart of a method of the invention practiced in the context of the PDA of FIG. 1.

A method ME1 of the invention practiced in the context of PDA 10 is flow-charted in FIG. 4. A test program is initiated at step ST1. The initiation can occur in a number of ways. A test program can be initiated during system boot (power on). A test program can be initiated in response to a user action, such as depressing a particular combination of buttons concurrently. A test program can be initiated automatically as part of an exception handling routine in response to an error detected during operation of an application program. A test program can be used to assist in software debug.

Processor 20 writes data to test-drive registers at step ST2. This step involves writing data to registers built into system-bus peripherals or to registers in a test-mode selector or both.

Multiplexers are switched at step ST3 so that peripheral ports normally coupled to non-system-bus data paths during execution of application programs are decoupled and the registers are coupled to the non-system-bus data paths instead. Step ST3 can be essentially concurrent with step ST2, especially in the preferred case in which some bit positions of the register control the multiplexer. In other cases, the multiplexer can be switched after data is entered into the registers.

Test results are read at step ST4 by addressing an appropriate test sampler point. This can simply involve reading a normal address associated with a bus peripheral. Alternatively, it can involve reading from a multiplexer that has been set so that it couples a test sampler (tap, sample-and-hold circuit, trigger logic, and/or edge-sensitive logic) from a non-system-bus port of a system-bus peripheral to the system bus. Also alternatively it can involve reading from a multiplexer that has been set so that is couples a test sampler from a non-system-bus node that is not connected to a system-bus peripheral. In this case, the multiplexer can be part of a test-mode selector.

While the modifications and method called for by the present invention are described in the context of a PDA, the invention applies generally to devices including integrated circuit systems that include processor, system bus, system-bus peripherals, and non-system bus connections. In addition for testing for problems with permanently attached devices, the method can be used for testing temporarily connected devices like PC cards, flash-memory cards, etc. These and other variations upon and modification to the described embodiments are provided for by the present invention, the scope of which is defined by the following claims.

What is claimed is:

1. A computer system comprising:
   a data processor fabricated on an integrated circuit;
   a system bus;
   a set of peripherals, said set including memory, said memory storing an application program and a test program, said peripheral set including a first peripheral;
   a multiplexer having a first multiplexer input, a second multiplexer input, a multiplexer output, and a multiplexer control input, said first peripheral being connected either to said first multiplexer input or to said multiplexer output;
   a remote functional module being coupled to the other of said first multiplexer input and said multiplexer output;
   a test register having an input coupled to said system bus, said test register having an output coupled to said second multiplexer input, said test register being addressable by said processor during execution of the test program, the test register having a width greater than a width of the second multiplexer input; and
   test-mode control means for selecting said second multiplexer input only in response to execution of said test program by said processor and not in response to execution of said application program by said processor, said remote functional module being disconnected from the system bus during execution of the application program and coupled to the system bus through at least one intervening peripheral device during execution of the test program.

2. A computer system as recited in claim 1 wherein said system bus, set of peripherals, and said multiplexer are fabricated on said integrated circuit.

3. A computer system as recited in claim 2 wherein said remote functional module is fabricated on said integrated circuit.

4. A computer system as recited in claim 2 wherein said remote functional module is external to said integrated circuit.

5. A computer system as recited in claim 1 wherein said test-mode control means includes bit positions of said register coupled to said multiplexer control input.

6. A computer system as recited in claim 1 wherein said test-mode control means includes a test-mode control peripheral connected to said system bus and coupled to said multiplexer control input.

7. A computer system as recited in claim 1 wherein said first peripheral is coupled to said system bus and to said first multiplexer data input, said control means being included in said first peripheral and coupled to said multiplexer control input.

8. A computer system as recited in claim 1 wherein said first peripheral has an output coupled to said first multiplexer data input.

9. A computer system as recited in claim 1 wherein said first peripheral has an input coupled to said multiplexer data output.

10. An integrated circuit implementing a computer system with normal and test modes of operation comprising:
    a system bus;
    memory for storing an application program and a test program, said memory being coupled to said system bus;
    a processor for executing said test program and said application program, said processor being coupled to said system bus, said processor accessing said memory via said system bus;
    a receiving functional module;
    a transmitting function module, said transmitting functional module being coupled to said receiving functional module for transmitting data thereto via a path that does not include said system bus;
    a mode selector for selectively coupling and decoupling said path to said bus in response to execution of said test program by said processor so that said processor can transmit data to said receiving functional module from said bus to said path, said mode selector decoupling said path from said bus while said processor is executing said application program, said receiving functional module being disconnected from the system bus during execution of the test program and coupled to the system bus through at least one intervening peripheral device during execution of the application program; and
    wherein said path includes a test register addressable by said processor during execution of the test program, the test register having a width greater than the width of the path.

11. An integrated circuit as recited in claim 10 wherein said mode selector includes a multiplexer with a "normal" input coupled to said transmitting functional module for receiving data generated by said transmitting functional module and a "test-mode" input coupled to said bus for receiving data therefrom.

12. An integrated circuit as recited in claim 11 wherein said multiplexer is controlled by said transmitting functional module as a function of an address asserted by said processor.

13. An integrated circuit as recited in claim 11 further comprising a test-mode controller, said test-mode controller controlling said multiplexer as a function of an address asserted by said processor and received by said test-mode controller.

14. An integrated circuit as recited in claim 13 wherein said test-mode controller includes a register for storing test data provided thereto by said processor via said system bus, said register being coupled to said test-mode input of said multiplexer for providing test data stored therein to said test-mode input.

15. An integrated circuit as recited in claim 14 wherein said register also stores configuration data, said register being coupled to said multiplexer so that said configuration data determines whether said test-mode input is the active input of said multiplexer.

16. An integrated circuit as recited in claim 13 wherein said data input of said receiving functional module is coupled to said test-mode controller, said test-mode controller coupling said receiving functional module input to said system bus in response to an address asserted by said processor.

17. An integrated circuit as recited in claim 11 wherein said receiving functional module couples said receiving functional module input to said system bus in response to an address asserted by said processor.

18. In a method of testing an integrated circuit providing a computer system with a processor, memory, and a transmitting functional module, as well as a system bus coupled to said processor, said memory, and said transmitting functional module, said transmitting functional module having a data output coupled to a data input of a receiving functional module via a path not including said system bus, said path including a test register addressable by the processor, the register having a width greater than a width of the path, said receiving functional module being disconnected from the system bus during execution of an application program by said processor and coupled to the system bus through at least one intervening peripheral device during execution of a test program by said processor, the method comprising:

initiating execution by said processor of the test program stored in said memory, said test program causing said processor to effect the following steps;

switching a multiplexer so that said system bus is coupled to said path so that said processor can write data to said data input of said receiving functional module via said system bus and via said path; and writing data to said data input of said receiving functional module via said system bus and via said path.

19. A method as recited in claim 18 wherein in said step of switching said multiplexer, said processor commands said transmitting functional module to switch said multiplexer.

20. A method as recited in claim 18 wherein, in said step of writing data to said data input involves writing data first to a register of a test-mode selector, and said step of switching said multiplexer involves said processor commanding said test-mode selector to switch said multiplexer.

21. A method as recited in claim 20 wherein said commanding involves including in said data written to said register data indicating that said multiplexer is to be switched, said register being coupled to said multiplexer to effect such switching.

22. A method as recited in claim 18 further comprising reading from an address associated with said data input, said data received threat being transmitted to said processor via said system bus.

23. A method as recited in claim 22 wherein said address associated with said data input is decoded by said receiving functional module.

24. A method as recited in claim 22 wherein said address associated with said data input is decoded by a test-mode selector, said test-mode selector forwarding said data from said data input to said processor via said system bus.

* * * * *